(12) United States Patent
Jang et al.

(10) Patent No.: US 11,121,012 B2
(45) Date of Patent: Sep. 14, 2021

(54) SUBSTRATE CLEANING APPARATUS AND CLEANING METHOD USING THE SAME

(71) Applicant: SAMSUNG DISPLAY CO., LTD., Yongin-si (KR)

(72) Inventors: Sukchang Jang, Yongin-si (KR); Taeyoung Kwon, Yongin-si (KR); Dongmin Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 438 days.

(21) Appl. No.: 15/831,563

(22) Filed: Dec. 5, 2017

(65) Prior Publication Data

US 2018/0193884 A1 Jul. 12, 2018

(30) Foreign Application Priority Data

Jan. 10, 2017 (KR) .................. 10-2017-0003397

(51) Int. Cl.
*H01L 21/677* (2006.01)
*H01L 21/67* (2006.01)
(Continued)

(52) U.S. Cl.
CPC .......... *H01L 21/67173* (2013.01); *B08B 1/02* (2013.01); *H01L 21/67028* (2013.01); (Continued)

(58) Field of Classification Search
CPC ......... H01L 21/67747; H01L 21/67754; H01L 21/6776
See application file for complete search history.

(56) References Cited

U.S. PATENT DOCUMENTS

2002/0092548 A1* 7/2002 Park .................... B08B 3/00
134/61
2003/0230468 A1* 12/2003 Uh .................. B65G 13/12
198/817
(Continued)

FOREIGN PATENT DOCUMENTS

JP 2007-152613 6/2007
JP 2010-167626 8/2010
(Continued)

OTHER PUBLICATIONS

Korean Office Action dated Sep. 16, 2018 for Korean Patent Application No. 10-2017-0003397.

*Primary Examiner* — Mikhail Kornakov
*Assistant Examiner* — Ryan L Coleman
(74) *Attorney, Agent, or Firm* — F. Chau & Associates, LLC

(57) ABSTRACT

A substrate cleaning method includes: sequentially loading each of a plurality of substrates, one substrate substantially immediately after a preceding substrate, into an input unit, in which adjacent substrates of the plurality of substrates are spaced apart from each other by a predetermined first interval; sequentially transferring each of the plurality of substrates in which adjacent substrates of the plurality of substrates are separated by a predetermined second interval that is greater than the predetermined first interval; cleaning each of the plurality of substrates in a cleaning unit; and aligning, in an output unit, adjacent substrates to be separated by the predetermined first interval.

8 Claims, 16 Drawing Sheets

(51) Int. Cl.
    *B08B 1/02*      (2006.01)
    *H01L 21/68*     (2006.01)
    *H01L 51/56*         (2006.01)
    *H01L 27/32*         (2006.01)

(52) U.S. Cl.
    CPC .... *H01L 21/6776* (2013.01); *H01L 21/67178* (2013.01); *H01L 21/67259* (2013.01); *H01L 21/67742* (2013.01); *H01L 21/68* (2013.01); *H01L 21/681* (2013.01); *H01L 27/3244* (2013.01); *H01L 51/56* (2013.01)

(56) References Cited

U.S. PATENT DOCUMENTS

| | | |
|---|---|---|
| 2012/0031438 A1 | 2/2012 | Jheong et al. |
| 2013/0259610 A1* | 10/2013 | Halloran ........... H01L 21/67173 414/217 |
| 2013/0287529 A1 | 10/2013 | Yang et al. |
| 2014/0251386 A1* | 9/2014 | Sasaki .................... B08B 3/022 134/30 |
| 2019/0376203 A1* | 12/2019 | Ito ..................... H01L 21/67219 |

FOREIGN PATENT DOCUMENTS

| | | |
|---|---|---|
| JP | 4802016 | 8/2011 |
| KR | 20-0380863 | 3/2005 |
| KR | 10-0731522 | 6/2007 |
| KR | 102010095785 A | 9/2010 |
| KR | 10-1058460 | 8/2011 |
| KR | 10-2012-0014474 | 2/2012 |
| KR | 101634705 B1 | 6/2016 |

* cited by examiner

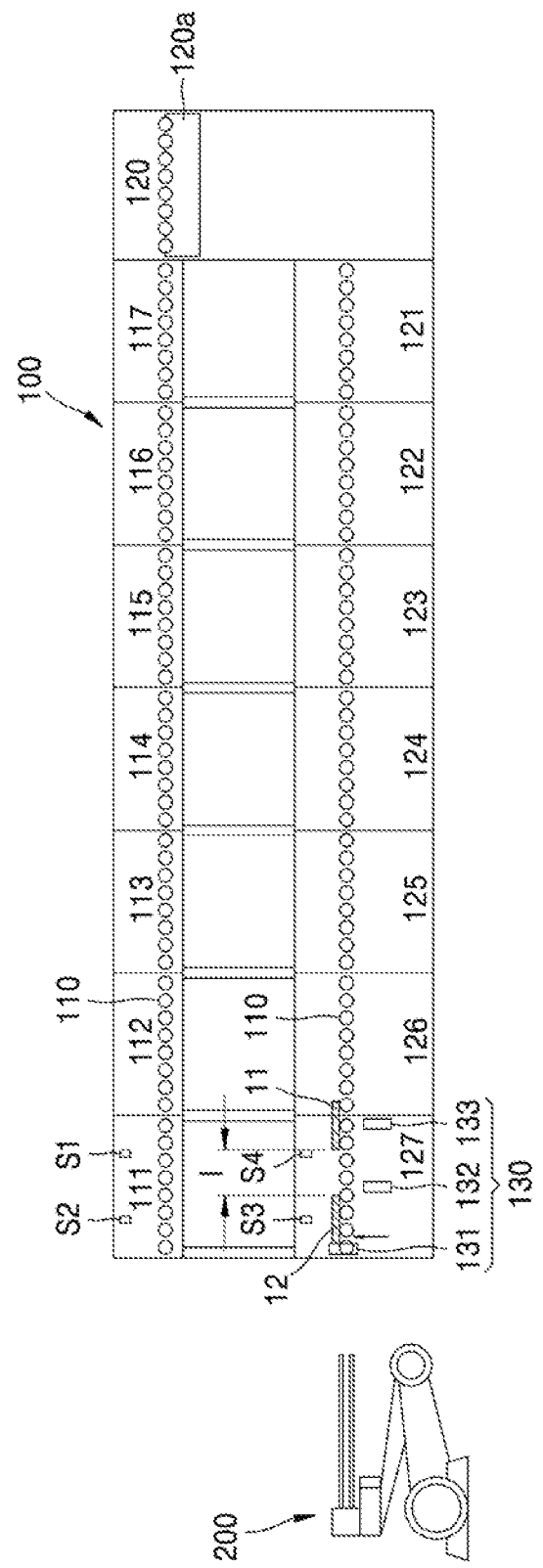

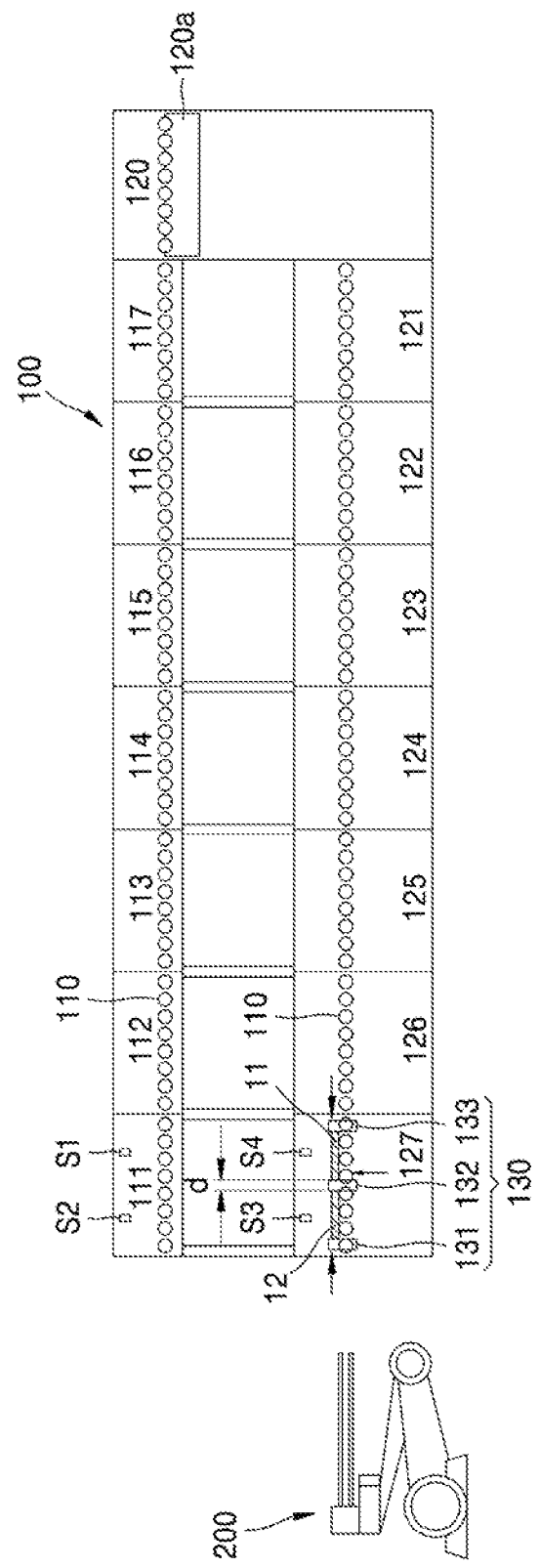

SUBSTRATE CLEANING APPARATUS AND CLEANING METHOD USING THE SAME

CROSS-REFERENCE TO RELATED APPLICATION

This application claims priority under 35 U.S.C. § 119 from, and the benefit of, Korean Patent Application No. 10-2017-0003397, filed on Jan. 10, 2017 in the Korean Intellectual Property Office, the contents of which are herein incorporated by reference in their entirety.

BACKGROUND

1. Technical Field

One or more embodiments are directed to substrate cleaning apparatuses and cleaning methods using the substrate cleaning apparatuses.

2. Discussion of the Related Art

When a display device, such as an organic light-emitting display device, is manufactured, a display portion that includes a thin film transistor and an organic light-emitting device is formed on a glass substrate to form a panel. The glass substrate is subjected to a cleaning process to clean the surface thereof, and is then supplied to the manufacturing process of the display panel.

SUMMARY

One or more embodiments provide an improved substrate cleaning apparatus that has stable cleaning quality while efficiently shortening the time required for cleaning substrates.

One or more embodiments provide a substrate cleaning method using the improved substrate cleaning apparatus.

Additional aspects will be set forth in part in the description which follows and, in part, will be apparent from the description, or may be learned by practice of the presented exemplary embodiments.

According to one or more embodiments, a substrate cleaning apparatus includes: an input unit that receives a plurality of substrates from a robot arm, wherein adjacent substrates of the plurality of substrates are separated by a predetermined interval; a cleaning unit that cleans each of the plurality of substrates received from the input unit; and an output unit that receives each of the plurality of substrates from the cleaning unit, wherein each of the input unit and the output unit includes a plurality of sensors that respectively detect the plurality of substrates, and the output unit includes an alignment unit that realigns adjacent substrates of the plurality of substrates to be separated by the predetermined interval. The predetermined interval between the two substrates while in the cleaning units is less than a length of each substrate in a traveling direction.

The alignment unit may include: a reference aligner positioned between adjacent substrates received in the output unit, wherein a thickness of the reference aligner is equal to the predetermined interval; and a pushing aligner that pushes the adjacent substrates into contact with the reference aligner.

The substrate cleaning apparatus may include a plurality of transfer rollers that transfer each of the plurality of substrates from the input unit to the output unit.

Each of the plurality of transfer rollers may include: a rotary shaft connected to a driving source; and a roller unit coupled to the rotary shaft that supports and transfers each of the plurality of substrates while rotating together with the rotary shaft.

The driving source may be a servo motor, and the servo motor and the rotary shaft may be connected to each other by a spiral bevel gear.

The plurality of transfer rollers in the input unit may be separately driven for each section of the input unit to sequentially move each of the plurality of substrates.

The input unit and the output unit may be on different levels, and the substrate cleaning apparatus may further include an elevating unit that transfers substrates between the different levels.

The input unit and the output unit may be on a same level.

The robot arm may extract substrates from the output unit.

According to one or more embodiments, a method for cleaning a substrate includes: sequentially loading, by a robot arm, each of a plurality of substrates, one substrate substantially immediately after a preceding substrate, into an input unit, in which adjacent substrates of the plurality of substrates are spaced apart from each other by a predetermined first interval; sequentially transferring each of the plurality of substrates, in which adjacent substrates of the plurality of substrates are separated by a predetermined second interval that is greater than the predetermined first interval; cleaning each of the plurality of substrates in a cleaning unit; and aligning, in an output unit, adjacent substrates to be separated by the predetermined first interval. The predetermined interval between the two substrates while in the cleaning units is less than a length of each substrate in a traveling direction.

Aligning adjacent substrates may include: positioning a reference aligner between the adjacent substrates, wherein a thickness of the reference aligner is equal to the predetermined first interval; and pushing, by a pushing aligner, the adjacent substrates into contact with the reference aligner.

The substrate cleaning method may further include transferring, by a plurality of transferring rollers, each of plurality of substrates from the input unit to the output unit.

Each of the plurality of transferring rollers may include a rotary shaft connected to a driving source, and a roller unit coupled to the rotary shaft that supports and transfers each of the plurality of substrates while rotating together with the rotary shaft.

The driving source may be a servo motor, and the servo motor and the rotary shaft may be connected to each other by a spiral bevel gear.

The substrate cleaning method may further include separately driving each of the plurality of transferring roller for each section of the input unit to sequentially move each of the plurality of substrates.

The input unit and the output unit may be on different levels, and the substrate cleaning method may further include transferring, by an elevating unit, each of the plurality of substrates between the different levels.

The input unit and the output unit may be on a same level.

The substrate cleaning method may further include: loading each of the plurality of substrates from a cassette into the input unit; and extracting each of the plurality of substrates from the output unit to the cassette.

According to one or more embodiments, a substrate cleaning apparatus includes: an input unit that receives a plurality of substrates to be cleaned, in which adjacent substrates of the plurality of substrates are separated by a predetermined interval; a cleaning unit that cleans each of the plurality of substrates received from the input unit; and an output unit that receives each of the plurality of substrates from the cleaning unit. The output unit comprises an alignment unit that includes a reference aligner positioned between adjacent substrates received in the output unit, in which a thickness of the reference aligner is equal to the predetermined interval, and a pushing aligner that pushes the adjacent substrates into contact with the reference aligner. The predetermined interval between the two substrates while in the cleaning units is less than a length of each substrate in a traveling direction.

Each of the input unit and the output unit may include a plurality of sensors that respectively detect the plurality of substrates. The substrate cleaning apparatus may further include a plurality of transfer rollers that transfer each of the plurality of substrates from the input unit to the output unit, and a robot arm that loads substrates into the input unit and extracts cleaned substrates from the output unit.

BRIEF DESCRIPTION OF THE DRAWINGS

FIGS. 3A to 3K are front views that sequentially illustrate a cleaning process using a substrate cleaning apparatus shown in FIG. 1.

DETAILED DESCRIPTION

Figure 1:
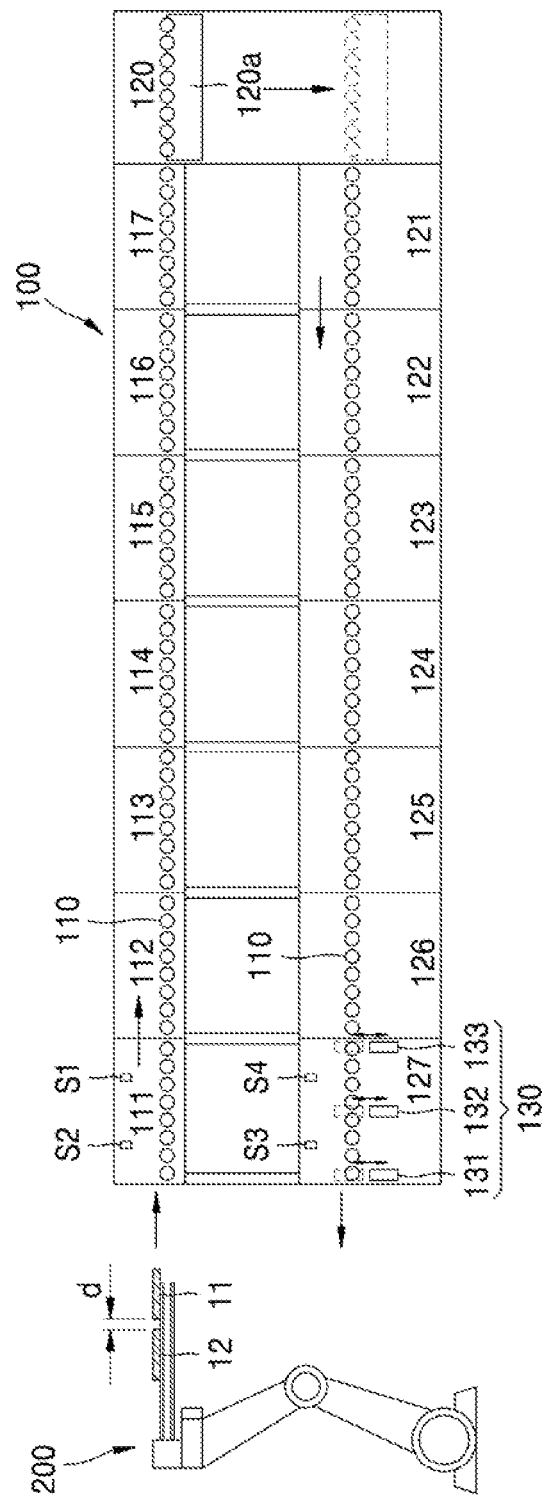
FIG. 1 is a front view of a substrate cleaning apparatus according to an embodiment.

Reference will now be made in detail to exemplary embodiments, examples of which are illustrated in the accompanying drawings, wherein like reference numerals may refer to like elements throughout. In this regard, exemplary embodiments may have different forms and should not be construed as being limited to the descriptions set forth herein.

It will be understood that when a layer, region, or element is referred to as being "formed on", another layer, region, or element, it can be directly or indirectly formed on the other layer, region, or element.

Sizes of elements in the drawings may be exaggerated for convenience of explanation.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween.

Herein, when two or more events are described as occurring one substantially immediately after the other, it is to be understood that the time between the end of a first event and the beginning of a second event is sufficiently small to be effectively zero, as would be understood by a person having ordinary skill in the art.

FIG. 1 schematically shows a structure of a substrate cleaning apparatus according to an embodiment.

A substrate cleaning apparatus according to an embodiment includes a process unit 100 in which a cleaning operation is performed in an in-line process, and a robot arm 200 that loads a plurality of substrates 11 and 12 into the process unit 100 and extracts the substrates therefrom later. Since the robot arm 200 is generally a robot for loading and unloading objects that are used in an automatic process, a detailed description thereof will be omitted, and the process unit 100 will be described in detail below.

According to an embodiment, the process unit 100 includes an input unit 111 into which two substrates 11 and 12 are sequentially loaded by the robot arm 200, one substantially immediately after the other, an output unit 127 from which the two substrates 11 and 12 that have undergone cleaning wait to be extracted by the robot arm 200, and cleaning units 122, 123, 124, and 125 which clean the two substrates 11 and 12 between the input unit 111 and the output unit 127. In other words, the two substrates 11 and 12 entering through the input unit 111 are cleaned in-line one after the other by the cleaning units 122, 123, 124, and 125, and after the cleaning, the robot arm 200 extracts the two substrates 11 and 12 to the output unit 127.

According to an embodiment, reference numerals 112, 113, 114, 115, 116, 117, 121, and 126 denote transferring units that transfer the two substrates 11 and 12, and reference numeral 120 denotes an elevating unit that transfer the two substrates 11 and 12 from an upper level having the input unit 111 to a lower level having the output unit 127. In a present embodiment, since the input unit 111 and the output unit 127 are arranged on different levels adjacent to the robot arm 200 so that one robot arm 200 may perform both a loading operation and an unloading operation, transfer between the different levels is performed through a lift 120a of the elevating unit 120.

According to an embodiment, reference numerals S1, S2, S3, and S4 denote sensors that sense the two substrates 11 and 12, and reference numeral 130 denotes an alignment unit that aligns the two substrates 11 and 12 to have a predetermined interval therebetween that is equal to the interval between the two substrates 11 and 12 when the two substrates 11 and 12 are loaded into the process unit 100. Functions of the sensors and the alignment unit will be described below. The predetermined interval between the two substrates while in the cleaning units is less than a length of each substrate in a traveling direction.

Figure 2:
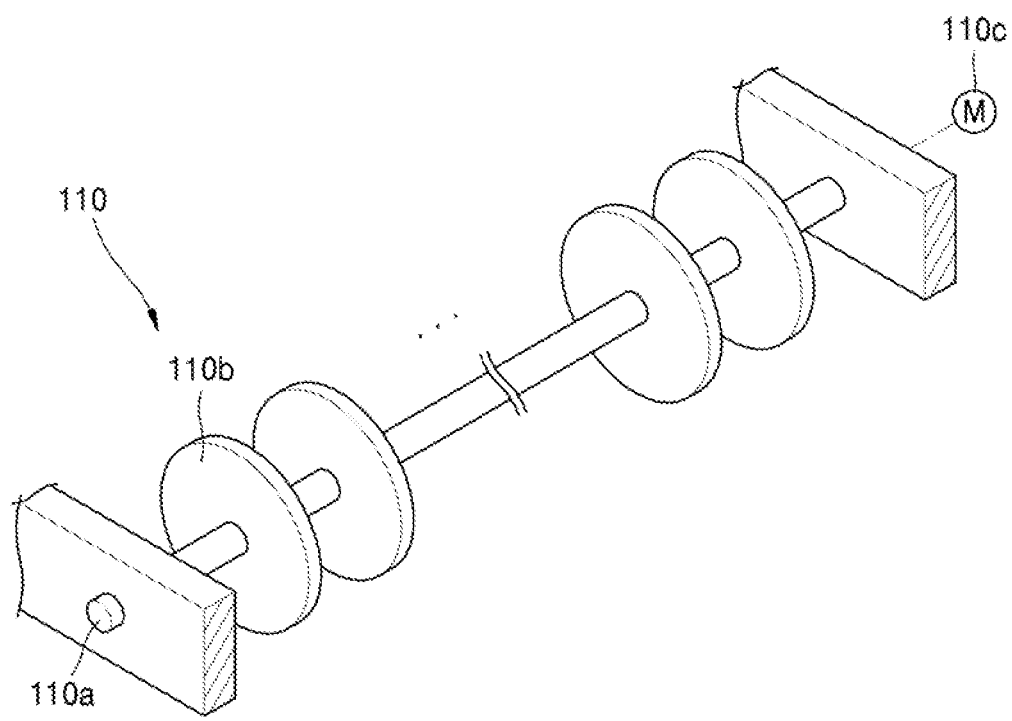
FIG. 2 is a perspective view that illustrates a structure of a transfer roller of a substrate cleaning apparatus shown in FIG. 1.

According to an embodiment, transfer rollers 110 are continuously arranged along the entire transfer path from the input unit 111 to the output unit 127 to transfer the two substrates 11 and 12. Referring to FIG. 2, each of the transfer rollers 110 includes a rotary shaft 110a connected to a driving source 110c and a plurality of roller units 110b coupled to the rotary shaft 110a. Accordingly, when the rotary shaft 110a is rotated by the power of the driving source 110c, the plurality of roller units 110b rotate together with the rotary shaft 110a to transfer the substrate 11 and 12 supported thereon. The plurality of roller units 110b coupled to the rotary shaft 110a are spaced apart from each other by predetermined intervals therebetween, and the alignment unit 130 includes aligners 131, 132, and 133 of, described below, that move up and down in the intervals between the roller units 110b. The driving source 110c and the rotary shaft 110a may be connected to each other by, for example, a spiral bevel gear. Since backlash can increase with the number of gear elements, additional gear elements may not be added to the spiral bevel gear. In addition, a servo motor with high control accuracy may be used as the driving source 110c.

According to an embodiment, a substrate cleaning process using the process unit 100 will be described below. First, referring to FIG. 6, a structure of an organic light-emitting display device that is an example of the cleaned substrates 11 and 12 is briefly described below.

Figure 6:
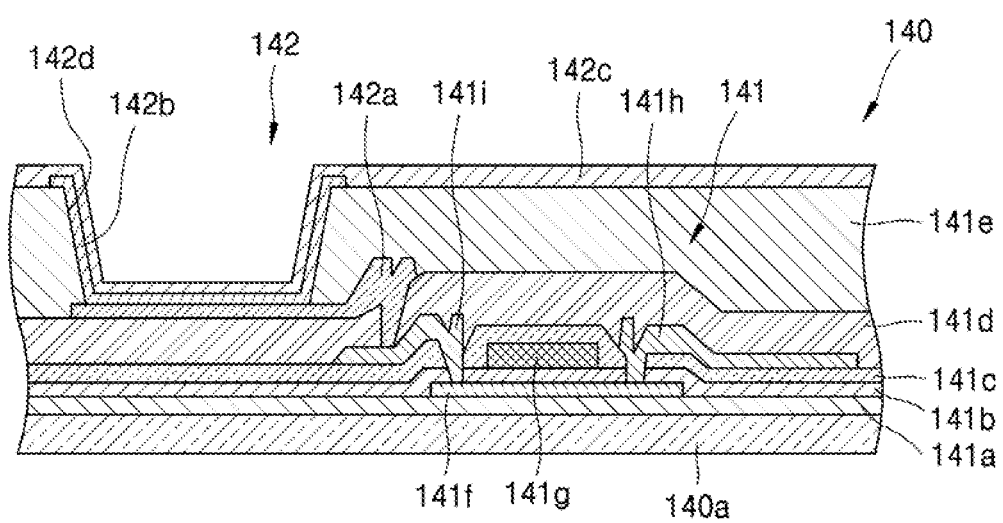
FIG. 6 is a cross-sectional view that illustrates a structure of an organic light-emitting display device that is an example of a substrate cleaned by a substrate cleaning apparatus according to embodiments.

According to an embodiment, as shown in FIG. 6, an organic light-emitting display device 140 has a structure in which a thin film transistor 141 and an organic light-emitting device 142 are arranged on a substrate 140a, and the cleaned substrates 11 and 12 may be used as the substrate 140a. More specifically, an active layer 141f is formed on a buffer layer 141a on the substrate 140a. The active layer 141f has source and drain regions doped with N-type or P-type impurities at a high concentration. A gate electrode 141g is formed on the active layer 141f with a gate insulating layer 141b interposed therebetween. A source electrode 141h and a drain electrode 141i are formed on the gate electrode 141g. An interlayer insulating layer 141c is disposed between the gate electrode 141g and the source and drain electrodes 141h and 141i, and a passivation layer 141d is interposed between the source and drain electrodes 141h and 141i and an anode electrode 142a of the organic light-emitting device 142.

According to an embodiment, the active layer 141f includes an oxide semiconductor. For example, the oxide semiconductor may include oxides of a material selected from Group 12, 13, or 14 metallic elements, such as zinc (Zn), indium (In), gallium (Ga), tin (Sn), cadmium (Cd), germanium (Ge), and hafnium (Hf), or a combination of the metallic elements. For example, the active layer 141f may include G-I-Z-O[$(In_2O_3)a(Ga_2O_3)b(ZnO)c$], where a, b, and c are real numbers satisfying conditions of a≥0, b≥0, and c>0, respectively.

According to an embodiment, an insulating planarization layer 141e is formed on the anode electrode 142a using an acrylic or similar material, and a predetermined opening 142d is formed in the planarization layer 141e.

According to an embodiment, the organic light-emitting device 142 emits red, green, or blue light according to a current flow to display predetermined image information. The organic light-emitting device 142 includes the anode electrode 142a connected to the drain electrode 141i of the thin film transistor 141 and receives a positive power from the drain electrode 141i, a cathode electrode 142c that covers all pixels and supplies a negative power, and an emission layer 142b that emits light is disposed between the anode electrode 142a and the cathode electrode 142c.

According to an embodiment, a hole injection layer (HIL), a hole transport layer (HTL), an electron transport layer (ETL), an electron injection layer (EIL), etc., are stacked adjacent to the emission layer 142b.

According to an embodiment, for reference, the emission layer 142b may be formed separately for each pixel so that pixels that emit red, green, or blue light are gathered to form one unit pixel. Alternatively, the emission layer 142b may be formed in common over the entire pixel region regardless of the pixel positions. In this case, the emission layer 142b is formed by vertically stacking or alternately arranging layers that include light-emitting materials that emit red, green, or blue light. Other colors may be combined if white light is emitted. In addition, the emission layer 142b may further include a color conversion layer that converts the emitted white light into a predetermined color, or a color filter.

According to an embodiment, the emission layer 142b is extremely vulnerable to moisture, and thus, a thin film encapsulating layer in which an organic layer and an inorganic layer are alternately stacked is formed over the cathode electrode 142c to protect the emission layer 142b.

Hereinafter, a process of stably and quickly cleaning the two substrates 11 and 12, which may be used as the substrate 140a of the organic light-emitting display device, using a substrate cleaning apparatus of a present embodiment will be described with reference to FIGS. 3A to 3K.

Figure 3A:
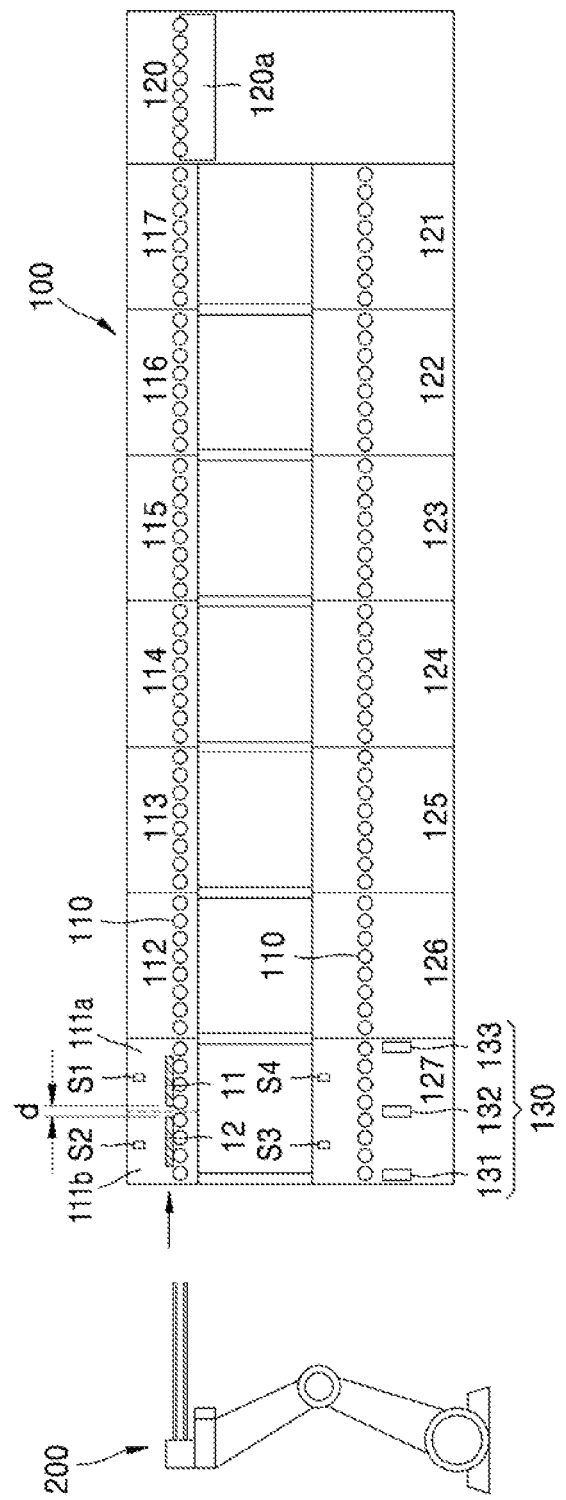

Referring to FIG. 3A, according to an embodiment, the robot arm 200 sequentially loads two substrates 11 and 12 extracted from a cassette into the input unit 111, one substantially immediately after the other. In this case, the two substrates 11 and 12 are spaced apart by a predetermined interval d which is maintained when the two substrates 11 and 12 are in the cassette and on the robot arm 200, with substrate 11 in front of substrate 12. When the two substrates 11 and 12 are loaded into the input unit 111, sensors S1 and S2 sense that the two substrates 11 and 12 have been loaded, and the transfer of the substrates 11 and 12 is started.

In this case, according to an embodiment, instead of simultaneously transferring the two substrates 11 and 12, transfer of the front substrate 11 is started first, and after a predetermined period of time, transfer of the rear substrate 12 is started. To this end, the transfer rollers 110 in the input unit 111 are separately driven for a section 111a in which the sensor S1 is present and a section 111b in which the sensor S2 is present.

Figure 3B:
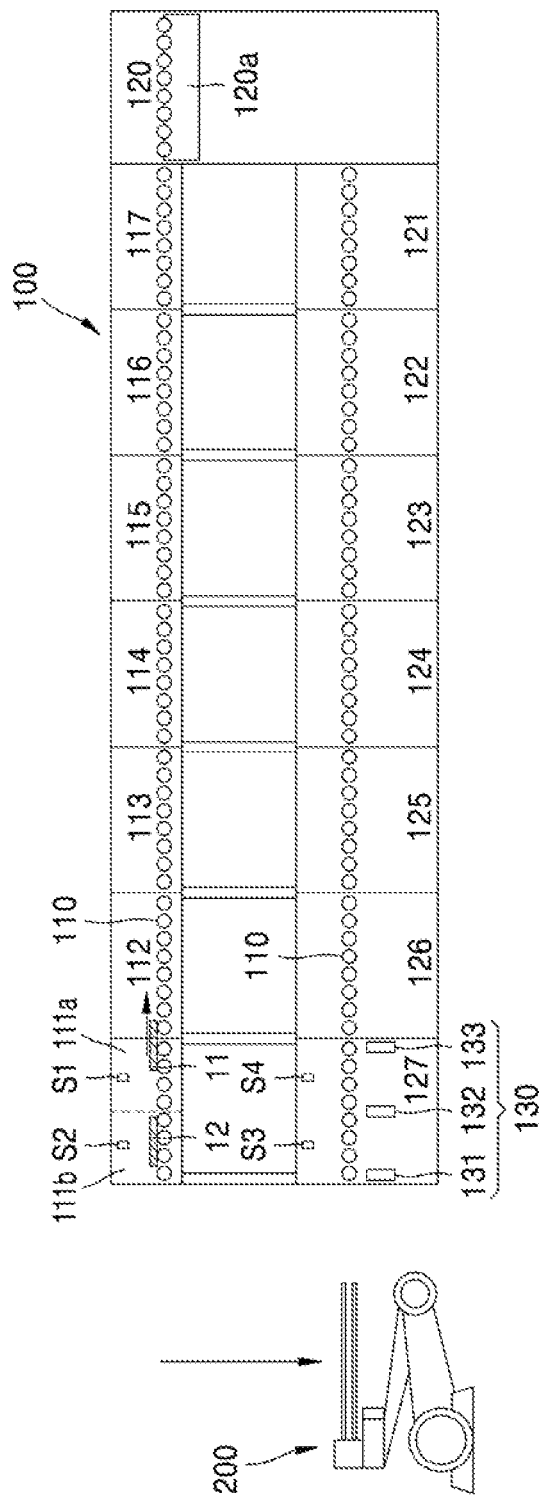
Figure 3C:
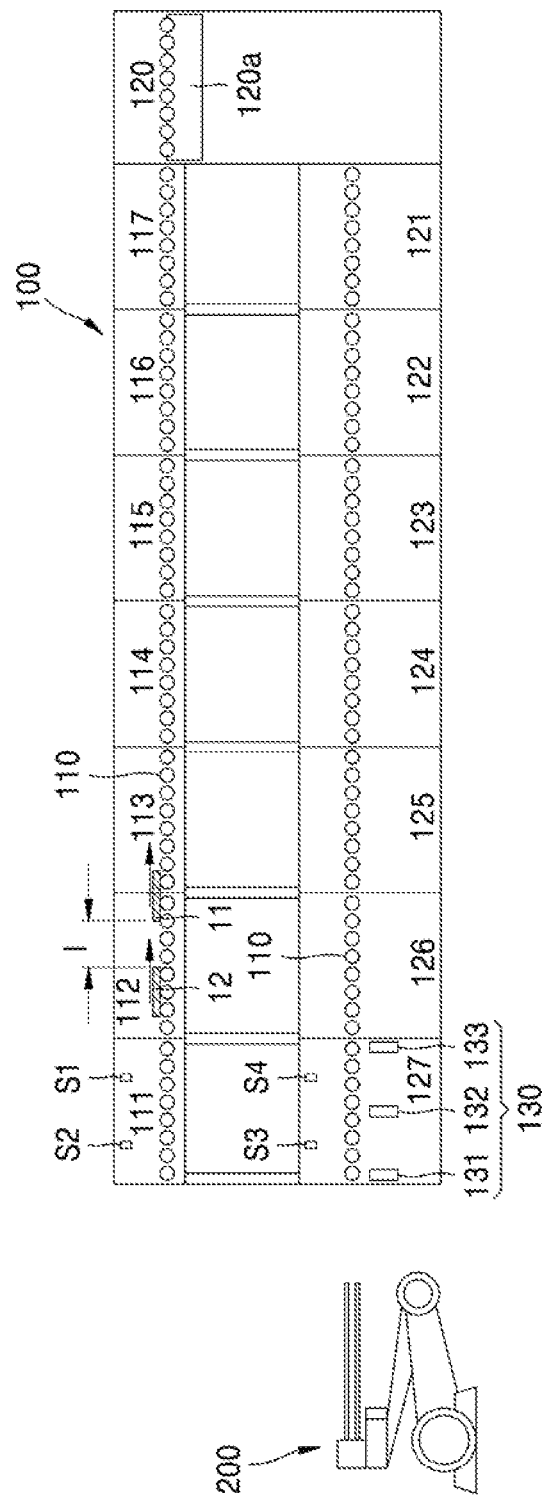

That is, according to an embodiment, as shown in FIG. 3B, only section 111a of the input unit 111, in which the sensor S1 is present, is operated when the front substrate 11 is transferred in. As shown in FIG. 3C, after a predetermined time period has elapsed, section 111b of the input unit 111, in which the sensor S2 is present, is operated together with section 111a of the input unit 111 when the rear substrate 12 is transferred in. Thus, an interval I greater than an initial interval, i.e., the predetermined interval d, is maintained between the two substrates 11 and 12 on the transfer rollers 110. If the interval between the substrates 11 and 12 is overly narrow, performing a process on the substrates 11 and 12 may cause the two substrates 11 and 12 to partially overlap each other during transfer, and thus not be properly cleaned.

Figure 3D:
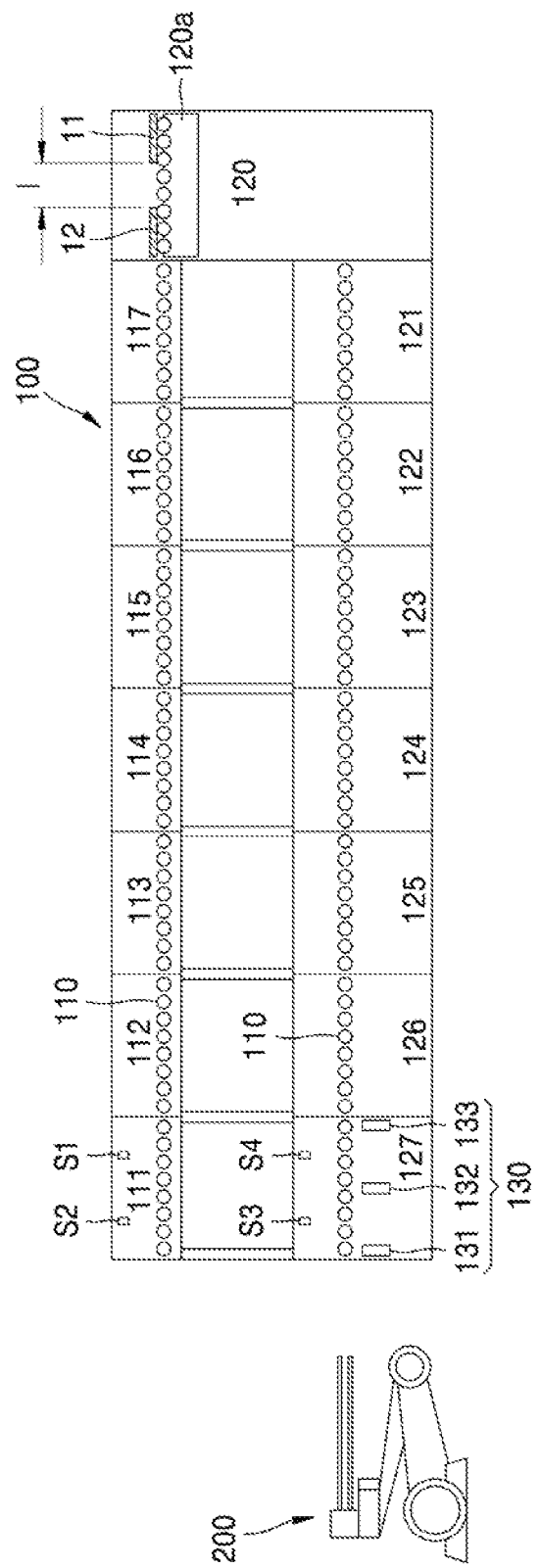
Figure 3E:
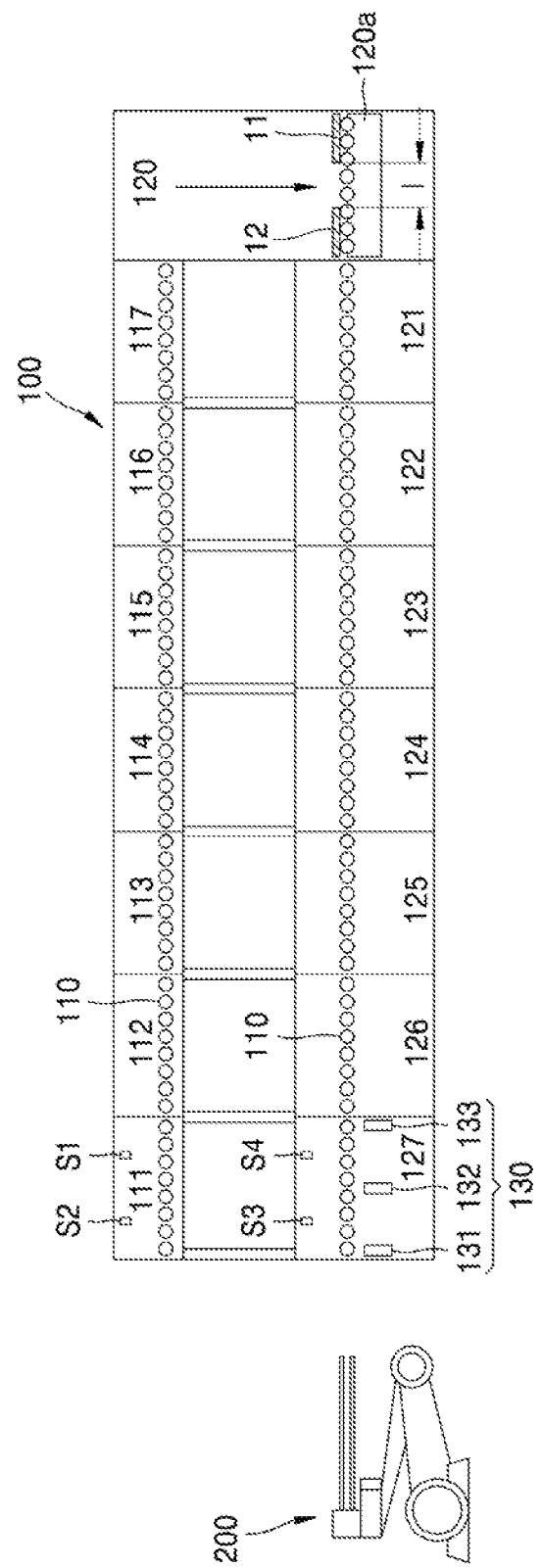

Next, according to an embodiment, the two substrates 11 and 12 enter the elevating unit 120 via the transferring units 112, 113, 114, 115, 116, and 117 in the upper level, as shown in FIG. 3D. The interval I is maintained on the transfer rollers of the lift 120a, and, in this state, the lift 120a descends to transfer the two substrates 11 and 12 to the lower level, as shown in FIG. 3E.

Figure 3F:
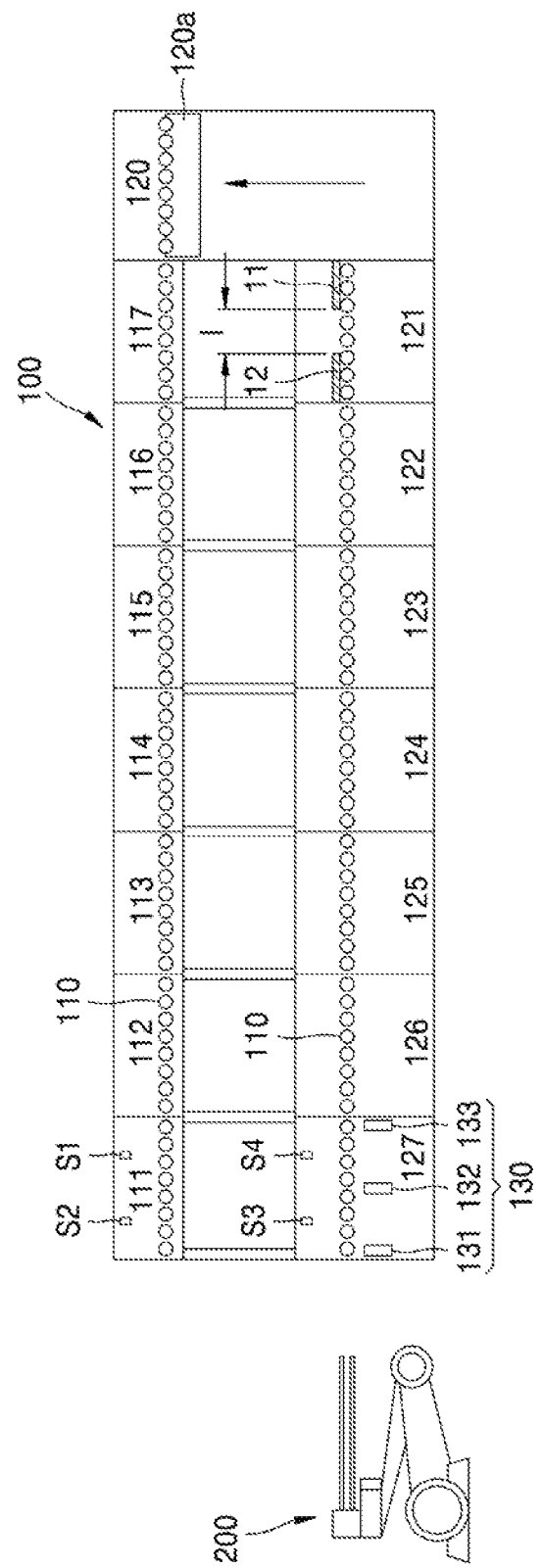

Subsequently, according to an embodiment, as shown in FIG. 3F, the two substrates 11 and 12 sequentially enter the transferring unit 121, one substantially immediately after the other, and the lift 120a rises substantially immediately after the two substrates 11 and 12 are unloaded therefrom, and waits for a next transfer operation.

Figure 3G:
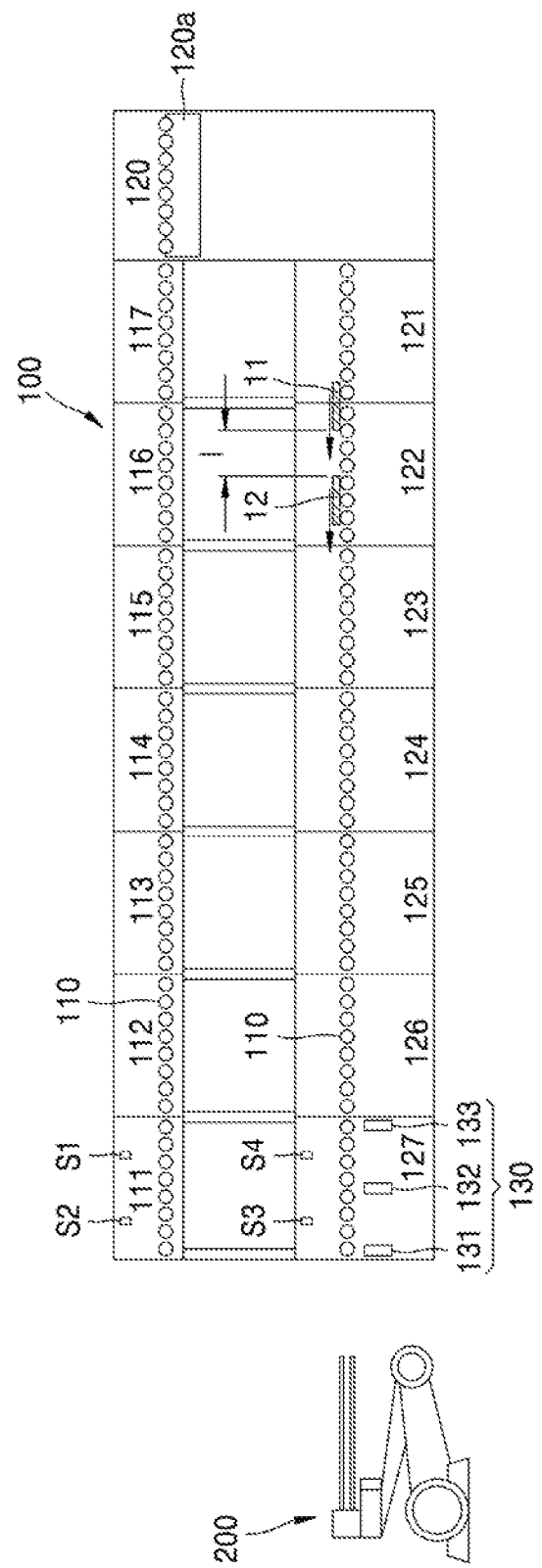

Next, according to an embodiment, as shown in FIG. 3G, the two substrates 11 and 12 are cleaned by the cleaning units 122, 123, 124, and 125 while maintaining the interval I.

Then, according to an embodiment, as shown in FIG. 3H, the two substrates 11 and 12 enter the output unit 127, where the alignment unit 130 rearranges the two substrates 11 and 12 to be separated by the initial interval d again, so that the robot arm 200 may stably reinsert the two substrates 11 and 12 back in their original positions in the cassette.

According to an embodiment, this rearrangement is performed as follows. As shown in FIG. 3H, the alignment unit 130 includes a reference aligner 132 and first and second pushing aligners 131 and 133 on both sides of the reference aligner 132. When a sensor S3 detects the entry of the substrate 12, the first pushing aligner 131 ascends and stops the first received substrate, substrate 12.

Figure 3I:
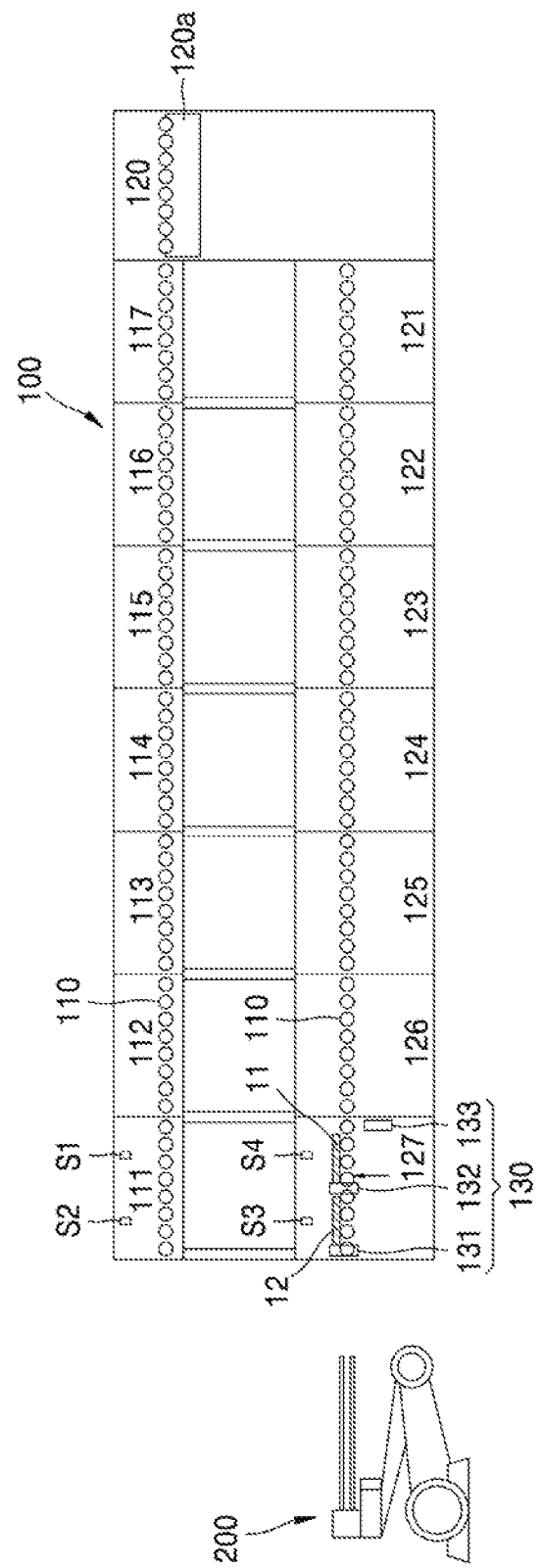

Next, according to an embodiment, as shown in FIG. 3I, when a sensor S4 detects the entry of the next substrate 11, the reference aligner 132 ascends between the two substrates 11 and 12 and stops the next substrate 11.

In this state, according to an embodiment, the second pushing aligner 133 also ascends as shown in FIG. 3J and the first and second pushing aligners 131 and 133 respectively push the two substrates 11 and 12 toward both sides of the reference aligner 132. Then the interval I between the two substrates 11 and 12 is reduced to become equal to the width d of the reference aligner 132. The thickness d of the reference aligner 132 is equal to the initial interval d. In other words, the thickness d of the reference aligner 132 is set to be the same as the initial interval d.

Figure 3K:
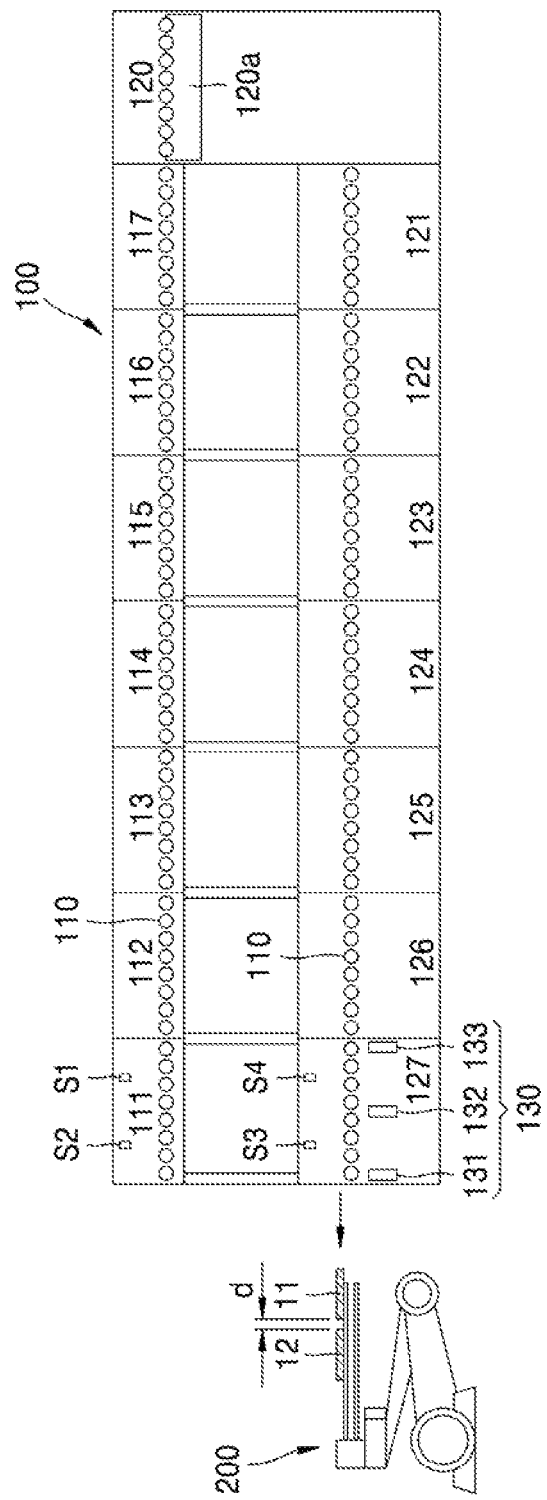

Thus, according to an embodiment, the two substrates 11 and 12 are realigned at the predetermined interval d that is the same as that when the two substrates 11 and 12 are loaded, the first and second pushing aligners 131 and 133 and the reference aligner 132 descend, and the robot arm 200 extracts the two substrates 11 and 12 from the output unit 127, as shown in FIG. 3K. The extracted substrates 11 and 12 are returned by the robot arm 200 to the cassette on which the two substrates were disposed before being loaded into the process unit 100.

According to an embodiment, since a plurality of substrates 11 and 12 are sequentially input into the process unit 100 and sequentially cleaned, one substantially immediately after the other, an operation speed is much faster than when cleaning the substrates 11 and 12 one by one. In addition, during a process according to an embodiment, since a distance between the substrates 11 and 12 is maintained at the sufficient interval I, overlapping of the substrates 11 and 12 can be prevented. Therefore, a substrate cleaning operation may be performed quickly and stably.

Figure 4:
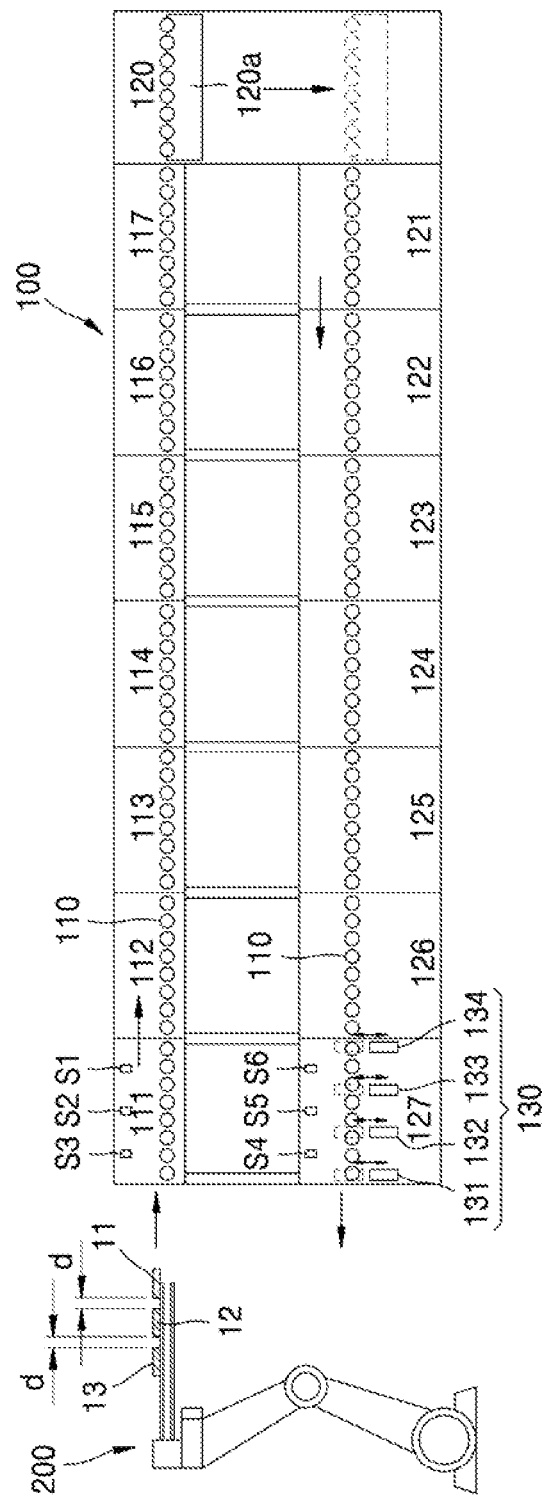
FIG. 4 is a front view of a substrate cleaning apparatus according to another embodiment.

In an above-described embodiment, a method of sequentially cleaning two substrates 11 and 12, one substantially immediately after the other, is described. However, according to an embodiment, it is also possible to sequentially clean three substrates 11, 12, and 13, one substantially immediately after the other, as shown in FIG. 4. According to embodiments, it is possible to sequentially clean four or more substrates, one substantially immediately after the other. To achieve this, the number of sensors S1, S2, S3, S4, S5, and S6 is increased to correspond to the number of substrates, and in an alignment unit 130, first to third pushing aligners 131, 133, and 134 are arranged with respect to the reference aligner 132. In this case, the second pushing aligner 133 also serves as a reference aligner having a thickness of the interval d.

Figure 5:
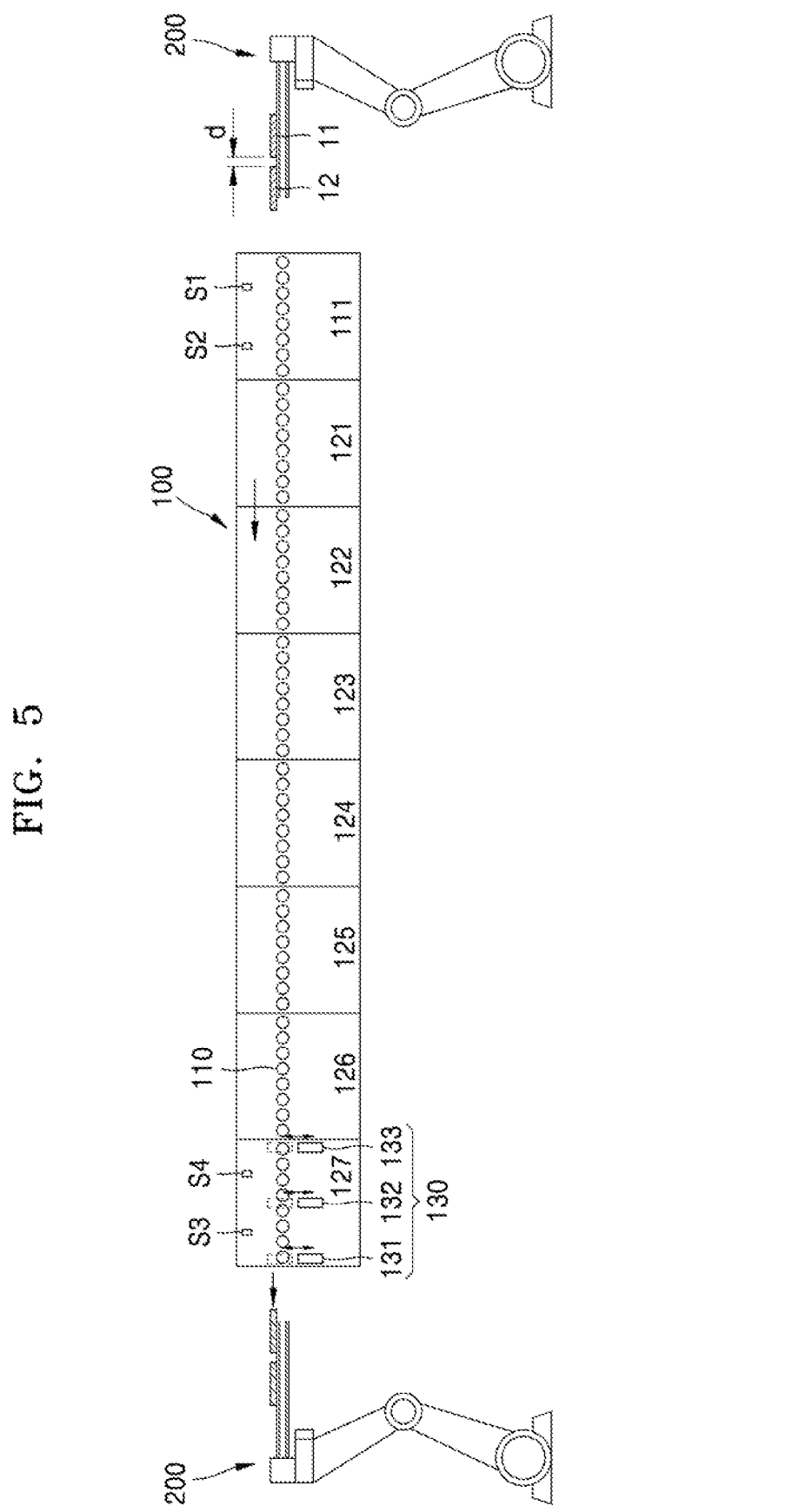
FIG. 5 is a front view of a substrate cleaning apparatus according to another embodiment.

In addition, according to an embodiment, as shown in FIG. 5, the elevating unit 120 may be omitted by configuring a transfer path as a single level instead of multiple levels. To this end, one robot arm is arranged on the input unit 111 side and another robot arm is arranged on the output unit 127 side. That is, a process according to a present embodiment, through which a plurality of substrates are stably sequentially cleaned, one substantially immediately after the other, can be realized with a transfer path not configured as multiple levels.

Therefore, according to an embodiment, by using a substrate cleaning apparatus and a substrate cleaning method according to exemplary embodiments described above, it is possible to improve a cleaning speed by sequentially inputting and cleaning a plurality of substrates, one substantially immediately after the other, and it is possible to prevent the plurality of substrates from overlapping during a cleaning process, by appropriately maintaining an interval between the input substrates. Thus, it is possible to realize stable cleaning quality while improving cleaning throughput of the substrates.

It should be understood that exemplary embodiments described above should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method for cleaning substrates, comprising:
    sequentially loading, by a robot arm, two substrates, one substrate after a preceding substrate, into an input unit, wherein the two substrates are spaced apart from each other by a predetermined first interval;
    sequentially transferring the two substrates, wherein the two substrates are transferred while being separated by a predetermined second interval that is greater than the predetermined first interval;
    cleaning the two substrates in a cleaning unit; and
    aligning, in an output unit, the two substrates such that the two substrates are separated by the predetermined first interval;
    wherein the predetermined second interval between the two substrates is less than a length of each substrate in a traveling direction while the substrates are in the cleaning unit, and
    wherein the step of aligning the two substrates comprises:
    positioning a reference aligner between the two substrates, wherein a thickness of the reference aligner is equal to the predetermined first interval; and
    pushing, by a first pushing aligner and a second pushing aligner, the two substrates such that the two substrates contact the reference aligner.

2. The substrate cleaning method of claim 1, further comprising
    transferring, by a plurality of transferring rollers, the two substrates from the input unit to the output unit.

3. The substrate cleaning method of claim 2, wherein each of the plurality of transferring rollers comprises
    a rotary shaft connected to a driving source, and
    a roller unit coupled to the rotary shaft, wherein the roller unit supports and transfers each of the two substrates while rotating together with the rotary shaft.

4. The substrate cleaning method of claim 3, wherein
    the driving source is a servo motor, and
    the servo motor and the rotary shaft are connected to each other by a spiral bevel gear.

5. The substrate cleaning method of claim 2, further comprising
    separately driving each of the plurality of transferring rollers for different sections of the input unit to sequentially move the two substrates.

6. The substrate cleaning method of claim 1, wherein
    the input unit and the output unit are on different levels, the substrate cleaning method further comprising transferring, by an elevating unit, the two substrates between the different levels.

7. The substrate cleaning method of claim 1, wherein the input unit and the output unit are on a same level.

8. The substrate cleaning method of claim 1, further comprising:
   loading the two substrates from a cassette into the input unit, and
   extracting the two substrates from the output unit to the cassette.

* * * * *